(12) United States Patent
Chen et al.

(10) Patent No.: US 8,943,453 B2
(45) Date of Patent: Jan. 27, 2015

(54) AUTOMATIC APPLICATION-RULE CHECKER

(75) Inventors: Ker-Min Chen, Hsin-Chu (TW); Shien-Po Yang, Taipei (TW); Vincent Merigot, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 637 days.

(21) Appl. No.: 12/813,849

(22) Filed: Jun. 11, 2010

(65) Prior Publication Data

US 2011/0055778 A1 Mar. 3, 2011

Related U.S. Application Data

(60) Provisional application No. 61/237,991, filed on Aug. 28, 2009.

(51) Int. Cl.
*G06F 17/50* (2006.01)
*G06F 9/445* (2006.01)

(52) U.S. Cl.
CPC .......... *G06F 17/5081* (2013.01); *G06F 17/505* (2013.01); *G06F 9/44505* (2013.01); *G06F 17/504* (2013.01)
USPC ............................. 716/111; 716/110; 716/106

(58) Field of Classification Search
None
See application file for complete search history.

(56) References Cited

U.S. PATENT DOCUMENTS

| | | | | |
|---|---|---|---|---|
| 5,150,308 A | * | 9/1992 | Hooper et al. | ................ 716/104 |
| 5,151,867 A | * | 9/1992 | Hooper et al. | ................ 716/104 |
| 5,903,469 A | | 5/1999 | Ho | |
| 6,078,737 A | | 6/2000 | Suzuki | |
| 6,560,571 B1 | * | 5/2003 | McBride | ......................... 703/14 |
| 6,678,871 B2 | * | 1/2004 | Takeyama et al. | ............ 716/114 |
| 6,735,749 B2 | | 5/2004 | Li et al. | |
| 7,155,689 B2 | * | 12/2006 | Pierrat et al. | ..................... 716/52 |
| 7,426,707 B2 | * | 9/2008 | Ichimiya | ...................... 716/119 |
| 8,183,569 B2 | * | 5/2012 | Arao | .............................. 257/71 |
| 2003/0061592 A1 | * | 3/2003 | Agrawal et al. | ................. 716/19 |
| 2007/0124709 A1 | * | 5/2007 | Li et al. | ............................ 716/5 |

OTHER PUBLICATIONS

V. Immaneni et al., Electrical Design Rule Checker for Core and Block Based ASIC Designs, Second Annual IEEE ASIC Seminar and Exhibit, p. 6/2/1-p. 6/2/4, Sep. 1989.*

* cited by examiner

*Primary Examiner* — A. M. Thompson
(74) *Attorney, Agent, or Firm* — Slater & Matsil, L.L.P.

(57) ABSTRACT

A method of checking an integrated circuit design database includes providing the integrated circuit design stored in a storage media; providing application rules; and providing an instance abstract of instances of libraries and IP(s). Instance-level information is extracted from the integrated circuit design database. An application-rule check is performed against the instance-level information using the information provided in an abstract file.

22 Claims, 4 Drawing Sheets

AUTOMATIC APPLICATION-RULE CHECKER

This application claims the benefit of U.S. Provisional Application No. 61/237,991 filed on Aug. 28, 2009, entitled "Automatic Application-Rule Checker," which application is hereby incorporated herein by reference.

TECHNICAL FIELD

This invention relates generally to integrated circuit design and manufacturing processes, and more particularly to methods for performing application-rule checks for the usage correctness of libraries and intellectual properties (IP).

BACKGROUND

In integrated circuit manufacturing processes, layouts of integrated circuits are designed, often in a graphic data system (GDS or GDSII) format. After the design is finished, the integrated circuits are taped-out to be manufactured on silicon wafers.

Generally, the tape-out of integrated circuits involves a high cost, typically ranging from hundreds of thousands of dollar to a million dollars. If the first tape-out is not successful and issues are found, iterations are needed to redesign the integrated circuits and to tape-out the integrated circuits again. The design cost is thus increased. Further, the time-to-market becomes significantly longer. Therefore, it is important to achieve success in the first tape-out (first silicon success).

To ensure the first silicon success, various methods were used to check the correctness of integrated circuit design. U.S. Pat. No. 6,078,737 describes a method for performing design-rule checks on layouts of integrated circuits, wherein the geometry of polygons in the layouts is checked to ensure that the geometry of the polygons do not violate any design rule required by manufacturing processes. The polygons are the shapes of the components in the integrated circuits. For example, the width of the polygons may be checked to ensure the minimum width requirement of features can be met.

U.S. Pat. No. 5,903,469 describes a method for performing a layout-versus-schematic check, wherein device (the assembly of polygons) types, dimensions, and interconnections are checked by comparing the layout of a design (in GDS format) and the schematic (in Netlist format) of the design.

U.S. Pat. No. 6,735,749 describes a method for performing a design-rule check or an electrical-rule check, wherein specific connections of circuits are checked. For example, some of the nodes cannot be connected to power, but can be connected to ground. Therefore, the check is performed to ensure these nodes are not connected to power.

The methods described in the above-recited patents, however, cannot guarantee the first silicon success. It is observed that all three methods are related to the checking of the layout geometry of libraries and intellectual properties (IP), while the application and usage correctness of libraries and IP(s) cannot be checked. In other words, the above-recited patents only describe the checking of the correctness in the design and layout of libraries and IP(s), while the correctness in the use of libraries & IP(s), which are related not only to libraries and/or IPs themselves, but also to the interactions between library and library, library and IP, and IP and IP, is not checked. Further, some of the libraries and IP(s) may have specific requirements. Taking an I/O library as an example, a particular standard I/O cell cannot adjoin certain other types of standard I/O cells. These cell-specific requirements also cannot be enforced by the methods described in the above-recited patents.

Conventionally, the application rules, which specify how a library or IP should be used, were only specified in documents known as application notes. The application-rule checks were manually performed by the library/IP users (i.e., designers), who inspect the integrated circuit layout to ensure that the application rules specified in the application notes are enforced. However, the application notes often include hundreds of pages. It is extremely difficult for users of the libraries and IP(s) to comprehend all application rules specified in the application notes. Further, as process technology continuously evolves forward, more and more application rules are needed, leading to a drastic increase in the usage complexity of the libraries and IP(s). As such, the problems caused by the misuse of the libraries and IP(s) will further increase, and a chance to achieve the first silicon success lessens.

SUMMARY

In accordance with the present invention, a method of checking an integrated circuit design includes setting up application rules for the libraries and IP(s) and extracting instance-level information from the integrated circuit design database using a tool. An abstract file that contains library/IP electrical and physical information is used. An application-rule check is performed on the instance-level information extracted from the integrated circuit design database using a tool together with an application rule command file, and an abstract file that contains physical and electrical information of library/IP.

Other embodiments are also disclosed.

BRIEF DESCRIPTION OF THE DRAWINGS

For a more complete understanding of the disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the embodiments.

An automatic application-rule checking system and the method of using the same are provided in accordance with an embodiment. The variations of the embodiment are discussed.

In integrated circuit design, the libraries and intellectual properties (IP(s)) are interconnected. Throughout the description, the libraries and/or IPs (libraries/IPs) are alternatively referred to as instances. As is known in the art, an IP is a pre-designed and verified integrated circuit having a specific function, which may be replicated in the design of larger integrated circuits. A library may include multiple IPs. Accordingly, IPs may become the elements of a library.

Figure 1:
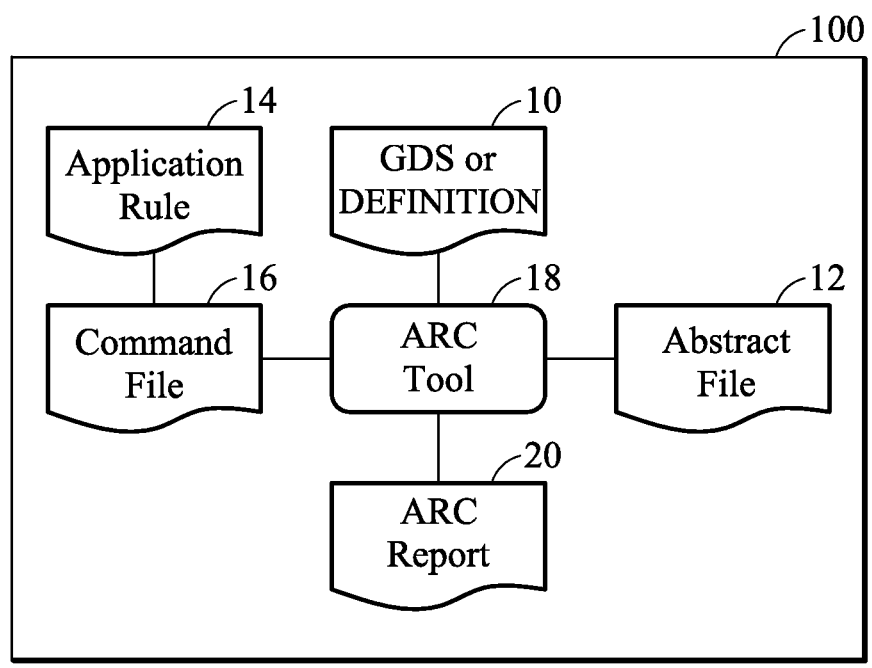
FIG. 1 illustrates a block diagram of an application-rule checking system in accordance with an embodiment.
Figure 2:
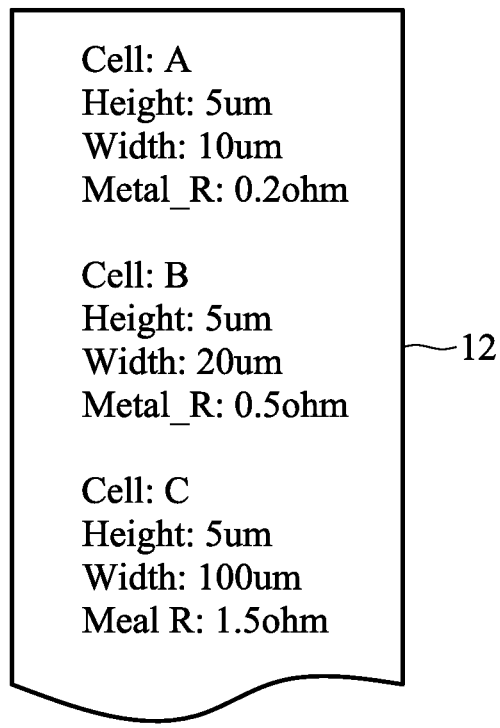
FIG. 2 illustrates a portion of an exemplary abstract file that contains library/IP physical and electrical information.

FIG. 1 illustrates a block diagram of automatic application-rule checking system 100 in accordance with an embodiment of the present invention. Referring to FIG. 1, the chip design database is processed, and an abstract file that includes properties of instances is also required (block 12). The extraction may be performed by a computer and the computer codes run by the computer. A portion of an exemplary abstract file 12 is illustrated in FIG. 2. The abstract file is used to expedite the tool execution time for application-rule check. The abstract file may include electrical and physical information of the library/IP. In an embodiment, while properties at levels lower than the instance-level may not be included. For example, the layout of the devices (such as transistors) and the properties of the components inside the devices (such as poly gates, well regions, and contact plugs) are not included in abstract file 12. In other words, the instance abstract in abstract file 12 is extracted by treating instances as black boxes, while the details in the black boxes are not included in abstract file 12.

In an embodiment, the abstract file 12 includes physical information and electrical information of each instance. FIG. 2 illustrates the information that may be contained in an abstract file. In FIG. 2, cells A, B, and C are the I/O cells that belong to a particular I/O library, and each I/O cell is regarded as an instance. The physical properties such as dimensions (length and width) of each instance (cell A, cell B, or cell C) are specified. In addition, other physical properties such as location, distance, and the like, may also be included.

The electrical properties of each instance are also included in abstract file 12. For example, parameter metal_R specifies the metal bus resistance of each instance, and will be discussed in detail in the subsequent paragraphs. It is noted that the information contained in an abstract file may include much more than what is illustrated. For example, the physical properties may also include the pin locations of each standard I/O cell. The electrical properties may also include the range of applicable voltages to each of the pins, and other electrical properties such as electron Migration (EM) capacity, Simultaneously Switching Output (SSO) driving factor, metal bus resistance, and the like, may also be included.

In the integrated circuit design, a definition (also known as floor plane database) of an integrated circuit (which may be in the form of a file stored in a storage media) may be designed first. The definition file indicated in FIG. 1 is the integrated circuit database that may be the floor plan or the netlist of the respective integrated circuit.

An integrated circuit design database may also be the layout of the integrated circuit. In an embodiment, the layout of the integrated circuit is in graphic data system (GDS or GDSII) format and stored in a storage media (refer to FIG. 4), although it may be in any other format. The layout includes instances of libraries and IP(s) and the devices (such as transistors, capacitors, resistors, connections, and the like) inside the instances in the form of geometry. The interface of the instances (such as the footprint including the boundary of the instances and pins connecting the instances to the outside) is also included as a part of (or can be extracted from) the layout. The definition file or the layout (GDS) is shown as block 10 of FIG. 1. Throughout the description, the layout and the definition file are both referred to as an integrated circuit design, although the definition file is only a partial design.

Referring to block 14 in FIG. 1, application rules are specified. Application rules 14 are different from commonly known design rules. As is known in the art, semiconductor fabrication process-related design rules layout the geometry of the integrated circuitry and are used to ensure that there is no process-related issue. For example, design rules may specify minimum widths of lines, the minimum spacing between lines, and the like. In other words, failure to specify a design rule may result in a process-related problem such as shorting between metal lines due to optical proximity effect. As a comparison, application rules are not process related, but related to the usage (rather than the design) of the library/IP. The application rules treat the instances as integrated units, and do not involve any feature at levels (such as device (transistor) level, or the level specifying components inside devices such as poly gates or active regions) lower than the instance level. Accordingly, the application rules are not related to the specific devices and components inside the instances. Rather, the application rules may treat the instances as black boxes.

In an embodiment, the application rules are specified to handle the physical and/or electrical effect of a group of instances. For example, in input/output (I/O) cells, the resistance from the metal bus of any I/O cell to any power ground cell cannot be greater than a certain value, such as 3 Ohms. Such a requirement may be specified by an application rule. The application rules may also include IP-specific usage rules related to the usage of a specific type of library/IP. For example, some type of I/O cells cannot be implemented right next to a certain type of other cells. Another example of the application rules is that a particular standard I/O cell can only be operated at a certain voltage. Such a requirement is IP-specific and cannot be specified by design rules.

Referring back to FIG. 1, the application rules are converted to logic operations, and may be stored in a command file (block 16 in FIG. 1), which is further stored in a storage media. The enforcement of the application rules is hence converted to the execution of the logic operations in command file 16. An application-rule checker (referred to as an ARC tool hereinafter, block 18) is then used to perform the application-rule check.

ARC tool 18 may go through the integrated circuit design (the GDS or the definition file, block 10 in FIG. 1). In an embodiment wherein a layout is provided, the ARC tool only needs to access to the instance level of the layout. ARC tool 18 does not need to go to any level (such as the device level) lower than the instance level. If the definition file instead of the layout is provided to ARC tool 18, the definition file itself may or may not be at the instance level and may or may not include any detail at levels lower than the instance level. Regardless of what kind of details the definition file include, ARC tool 18 also only needs to access the instance level and does not care about any detail in lower levels.

Figure 3:
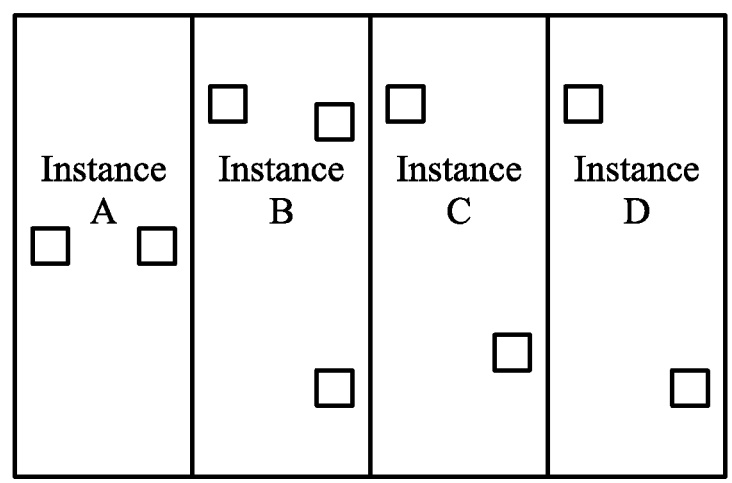
FIG. 3 illustrates a plurality of instances as a portion of an exemplary embodiment.

In an exemplary embodiment, ARC tool 18 goes through the layout or the definition file and extracts instance-level information such as what instances (e.g., an I/O cell or an IP) are at what locations, and how these instances are interconnected. The pins of the instances (connecting the instances to outside) and the interconnection between the pins of different instances are thus extracted. FIG. 3 illustrates exemplary extracted instance-level information, wherein instances A, B, C, and D and the respective pins (represented by small squares) are extracted. It is to be noted that the extracted instance-level information may, or may not, be in a graphic format. Rather, it may be in the format of a text file.

With the instance-level information of the integrated circuit design extracted, ARC tool 18 then goes through command file 16 and executes the logic operations specified in command file 16 to the instance-level information, and generates a report (block 20 of FIG. 1) of the application-rule check. In the application-rule check, the physical and electrical information included in the abstract file 12 is needed. In an exemplary embodiment, if the application rules (by the logic operations in command file 16) indicate that the resistance from the metal bus of any I/O cell to any power ground cell cannot be greater than 3 Ohms, then ARC tool 18 goes through the extracted instance-level information to find out what kind of cells are power ground cells and what kind of intermediate cells are located between an I/O cell that is being checked and the nearest power ground cell. ARC tool 18 then finds out the metal bus resistance metal_R (refer to FIG. 2) of the intermediate cells from abstract file 12, and adds the metal bus resistances of the intermediate cells and the metal bus resistance of the I/O cell together. If none of the added metal bus resistance exceeds 3 Ohms, then the respective application-rule check passes. Otherwise, the respective application-rule check fails, and the integrated circuit design may need to be modified. In an exemplary embodiment, as shown in FIG. 3, the metal bus resistance of instance A to a power ground cell instance D is equal to the sum of metal line resistances of instances A, B, and C.

In another exemplary embodiment, the application rules may specify that a certain type of instance cannot adjoin another type of instance. ARC tool 18 executes the respective logic operation in command file 16, and traverses the instance-level information of the integrated circuit design to find a certain type of instance. ARC tool 18 then finds all adjoining instances to make sure the adjoining instances are not the wrong ones.

In yet other embodiments, additional application rules may be included to specify physical rules, such as the maximum allowable distances between two instances, the allowable orientations of certain instances, and/or electrical rules such as simultaneously switching output noise, total electro-migration capacity, and the like. The check steps are similar to those that have been discussed in preceding paragraphs, and hence are not included. In these embodiments, addition properties may be specified in the abstract file to support the additional application rules.

Figure 4:
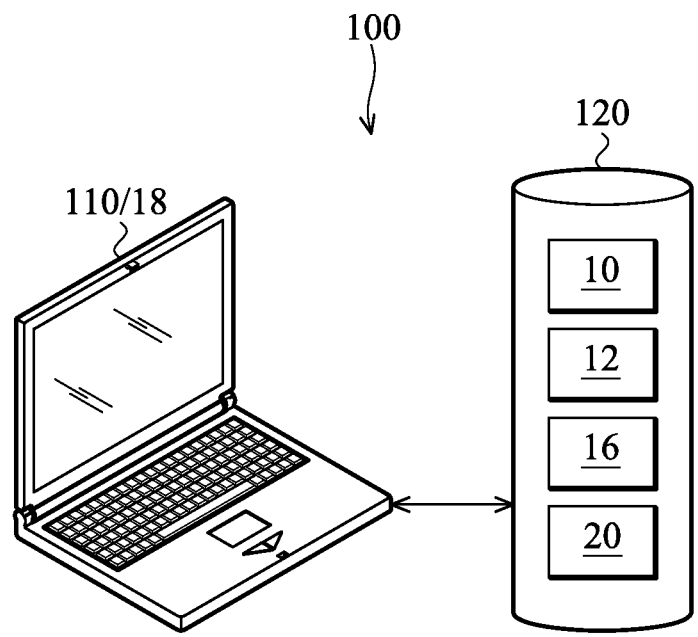
FIG. 4 illustrates an application rule checking system.

FIG. 4 illustrates block diagrams of application-rule checking system 100. In the above-discussed embodiments, ARC tool 18 may be a part of computer 110, and may include hardware components and software components. Command file 16, abstract file 12, and the GDS or definition 10 may be stored in a storage media 120, such as a hard drive, a disk, a tape, or the like, and may be accessed by computers (which may be ARC tool 18). ARC report 20 may be generated by a computer and stored in a storage media. Further, the extracted instance-level information may also be stored in a storage media.

Figure 5:
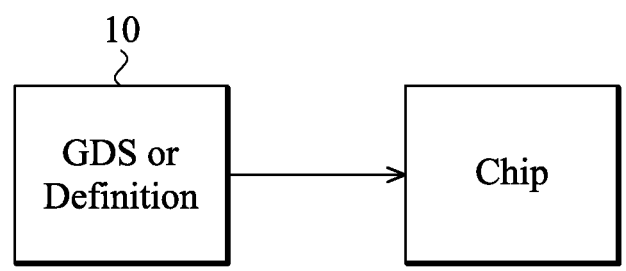
FIG. 5 illustrates a schematic arrangement of libraries and IP(s) of a portion of a semiconductor chip.

Referring to FIG. 5, after the application-rule checking passes, layout GDS file or the definition file 10 may be implemented on a chip, which may be a silicon chip, to form (physical) integrated circuits.

Figure 6:
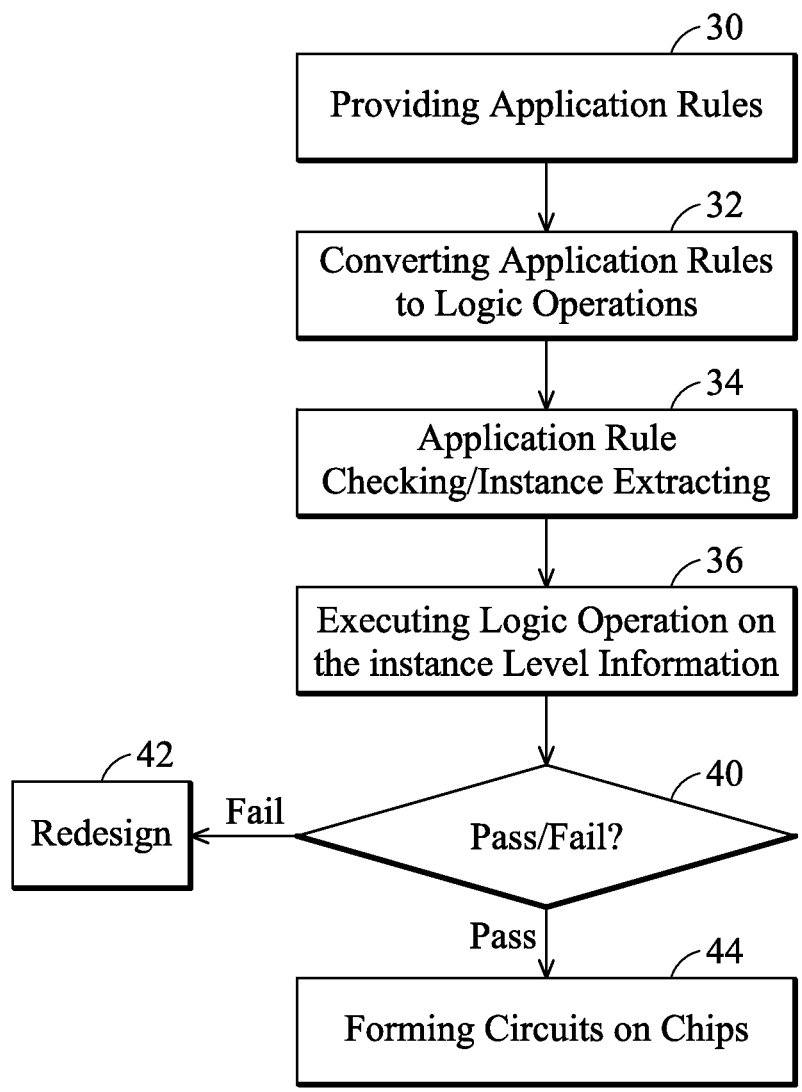
FIG. 6 illustrates an exemplary process flow in accordance with some exemplary embodiments.

In accordance with embodiments as illustrated in FIG. 6, application rules are provided, for example, in the form of a command file (step 30). The Application rules are converted to logic operations (step 32). Application rule checking (step 34) is performed, for example, by an application-rule checker. Instance level-information is extracted (step 34), wherein the instance-level information comprises information at levels no lower than the instance level, while the information lower than the instance level may not be extracted. The logic operations are performed on the instance-level information to perform the application-rule check (step 36). If the application-rule check fails (step 40), the respective circuits may be redesigned (step 42). Otherwise the integrated circuit may be on chips (step 44.)

The embodiments of the present invention have several advantageous features. With the automatic application-rule checking system, users of the library/IP no longer need to manually go through lengthy and complex application notes. It ensures the correctness of the integrated design, and the misuse of the application notes is avoided. Therefore, the first silicon success is more likely to be achievable, resulting in a significant reduction in design iterations and cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of checking an integrated circuit design, the method comprising:
   providing application rules;
   providing an abstract file containing electrical and physical information of intellectual properties (IPs), wherein the IPs are pre-designed and verified integrated circuits having specific functions, and wherein the abstract file excludes information at levels lower than an instance level;
   extracting, by a computer, instance-level information of the IPs from an integrated circuit design database, wherein the instance-level information excludes any devices or components at a transistor level or lower; and
   performing an application-rule check against the instance-level information based on the provided application rules.

2. The method of claim 1, wherein the instance-level information of the integrated circuit design excludes information at levels lower than an instance level.

3. The method of claim 1, wherein the abstract file comprises physical properties.

4. The method of claim 3, wherein the physical properties are selected from the group consisting essentially of a dimension of an instance and a pin location of an instance of the IPs.

5. The method of claim 1, wherein the instance-level information comprises electrical properties.

6. The method of claim 1, wherein performing the application-rule check comprises converting the provided application rules to logic operations, and executing the logic operations.

7. The method of claim 1, wherein the application rules are stored in a command file in a storage media in a form of logic operations, and wherein the performing the application-rule check comprises executing the logic operations on the instance-level information.

8. The method of claim 1, wherein the integrated circuit design comprises a layout of an integrated circuit, and wherein in the extracting the instance-level information, no information at any level lower than an instance level is extracted to the instance-level information.

9. The method of claim 1, wherein the integrated circuit design comprises a definition of an integrated circuit.

10. A method of performing an integrated circuit design, the method comprising:
providing the integrated circuit design;
providing a command file comprising application rules in a form of logic operations;
providing an abstract file of intellectual properties (IPs), wherein the IPs are pre-designed and verified integrated circuits having specific functions;
extracting, by a computer, instance-level information of the IPs from an integrated circuit design database, wherein the instance-level information excludes any devices or components at a transistor level or lower;
retrieving properties of instances of the IPs from the abstract file; and
executing the logic operations in the command file on the instance-level information of the integrated circuit design based on the properties retrieved from the abstract file.

11. The method of claim 10, wherein the abstract file comprises physical properties and electrical properties of the IPs.

12. The method of claim 11, wherein the providing the abstract file comprises extracting the electrical and physical information from the IPs.

13. The method of claim 10, wherein the integrated circuit design database comprises a layout of an integrated circuit, and wherein in the extracting the instance-level information, no information at any level lower than an instance level is extracted.

14. The method of claim 10, wherein the integrated circuit design database comprises a definition of an integrated circuit.

15. An integrated circuit checking system for checking application rules on an integrated circuit design, the integrated circuit checking system comprising:
a command file stored in a storage media and specifying application rules as logic operations;
an abstract file stored in the storage media and comprising an instance abstract of intellectual properties (IPs), wherein the IPs are pre-designed and verified integrated circuits having specific functions, wherein the instance abstract comprises properties of instances of the IPs, and wherein the abstract file excludes information of any devices or components at a transistor level or lower; and
an application-rule checker configured to execute the logic operations to instance-level information of the integrated circuit design, wherein the application-rule checker is further configured to retrieve the properties.

16. The integrated circuit checking system of claim 15, wherein the instance abstract comprises physical properties.

17. The integrated circuit checking system of claim 16, wherein the physical properties are selected from the group consisting essentially of a dimension of an instance and a pin location of an instance.

18. The integrated circuit checking system of claim 15, wherein the instance abstract comprises electrical properties.

19. The integrated circuit checking system of claim 18, wherein the electrical properties are selected from the group consisting essentially of an electro-migration capacity of an instance, a simultaneously switching noise of the instance, an acceptable voltage range of a pin of the instance, and a metal bus resistance of the instance.

20. The integrated circuit checking system of claim 15, wherein the instance abstract is saved in an abstract file.

21. The integrated circuit checking system of claim 15, wherein the integrated circuit design comprises a layout of an integrated circuit, and wherein no information at any level lower than an instance level is extracted to the instance-level information.

22. The integrated circuit checking system of claim 15, wherein the integrated circuit design is a definition of an integrated circuit.

* * * * *